United States Patent [19]

Suwa et al.

[11] Patent Number: 5,337,272

[45] Date of Patent: Aug. 9, 1994

[54] CIRCUIT FOR APPLYING SELECTED VOLTAGES TO DYNAMIC RANDOM ACCESS MEMORY

[75] Inventors: Makoto Suwa; Hiroshi Miyamoto; Shigeru Mori, all of Hyogo, Japan

[73] Assignee: Mitsubishi Denki Kabushiki Kaisha, Tokyo, Japan

[21] Appl. No.: 32,554

[22] Filed: Mar. 17, 1993

Related U.S. Application Data

[60] Continuation-in-part of Ser. No. 785,979, Oct. 31, 1991, abandoned, which is a division of Ser. No. 436,587, Nov. 15, 1989, Pat. No. 5,079,743.

[30] Foreign Application Priority Data

Dec. 28, 1988 [JP] Japan .................. 63-332237

[51] Int. Cl.$^5$ ............... G11C 11/40; G11C 11/407
[52] U.S. Cl. .................. 365/149; 365/189.03; 365/189.05; 365/201; 365/230.08
[58] Field of Search .......... 365/149, 189.03, 189.05, 365/190, 201, 226, 230.08; 371/21.4

[56] References Cited

U.S. PATENT DOCUMENTS

| | | | |
|---|---|---|---|
| 4,507,761 | 3/1985 | Graham | 365/233 |
| 4,527,254 | 7/1985 | Ryan et al. | 365/51 |
| 4,634,890 | 1/1987 | Lee | 307/530 |
| 4,734,880 | 3/1988 | Collins | 365/233 |
| 4,755,964 | 7/1988 | Miner | 365/233 |
| 4,764,900 | 8/1988 | Bader et al. | 365/230.06 |
| 4,839,865 | 6/1989 | Sato et al. | 365/201 |
| 4,852,063 | 7/1989 | McNutt | 365/189.05 |
| 4,970,727 | 11/1990 | Miyawaki | 371/21.3 |
| 4,972,102 | 11/1990 | Reis et al. | 307/530 |
| 4,996,672 | 2/1991 | Kim | 365/225.7 |

FOREIGN PATENT DOCUMENTS 62-192998 8/1987 Japan .
62-232155 10/1987 Japan .
62-252598 11/1987 Japan .

OTHER PUBLICATIONS

"Reliability of Nano-Meter Thick Multi-Layer Dielectric Films of Poly-Crystalline Silicon", Y. Ohji et al., Symposium of International Reliability Physics, 1987, IEEE, pp. 55-59.

Primary Examiner—Joseph L. Dixon
Assistant Examiner—Jack A. Lane
Attorney, Agent, or Firm—Lowe, Price, LeBlanc & Becker

[57] ABSTRACT

A dynamic random access memory (DRAM) includes a selection circuit for selecting the voltages used for aging. The selection circuit operates responsive to external control signals. When a source voltage (Vcc) is selected, the voltage (Vcc) is supplied to one electrode of a memory cell via a circuit 73 and a transmission gate while a ground potential (Vss) is supplied to the other electrode via a bit line and a transistor. Conversely, when the ground potential (Vss) is selected, an inverted voltage is applied across the two electrodes. In this manner, the insulating properties of an insulator interposed between the two electrodes can be checked more reliably during aging.

18 Claims, 7 Drawing Sheets

FIG.1A

SELECTION CIRCUIT 80

CIRCUIT FOR APPLYING SELECTED VOLTAGES TO DYNAMIC RANDOM ACCESS MEMORY

This application is a continuation-in-part of application Ser. No 07/785,979 filed Oct. 31, 1991, now abandoned which in turn is a divisional application of Ser. No. 07/436,587 filed on Nov. 15, 1989, which issued as U.S. Pat. No. 5,079,743 on Jan. 7, 1992.

BACKGROUND OF THE INVENTION

1. Field of the Invention

This invention relates in general to a dynamic random access memory device and, more particularly, to a dynamic random access memory which makes it possible to perform more effective aging.

2. Description of the Background Art

Figure 4:
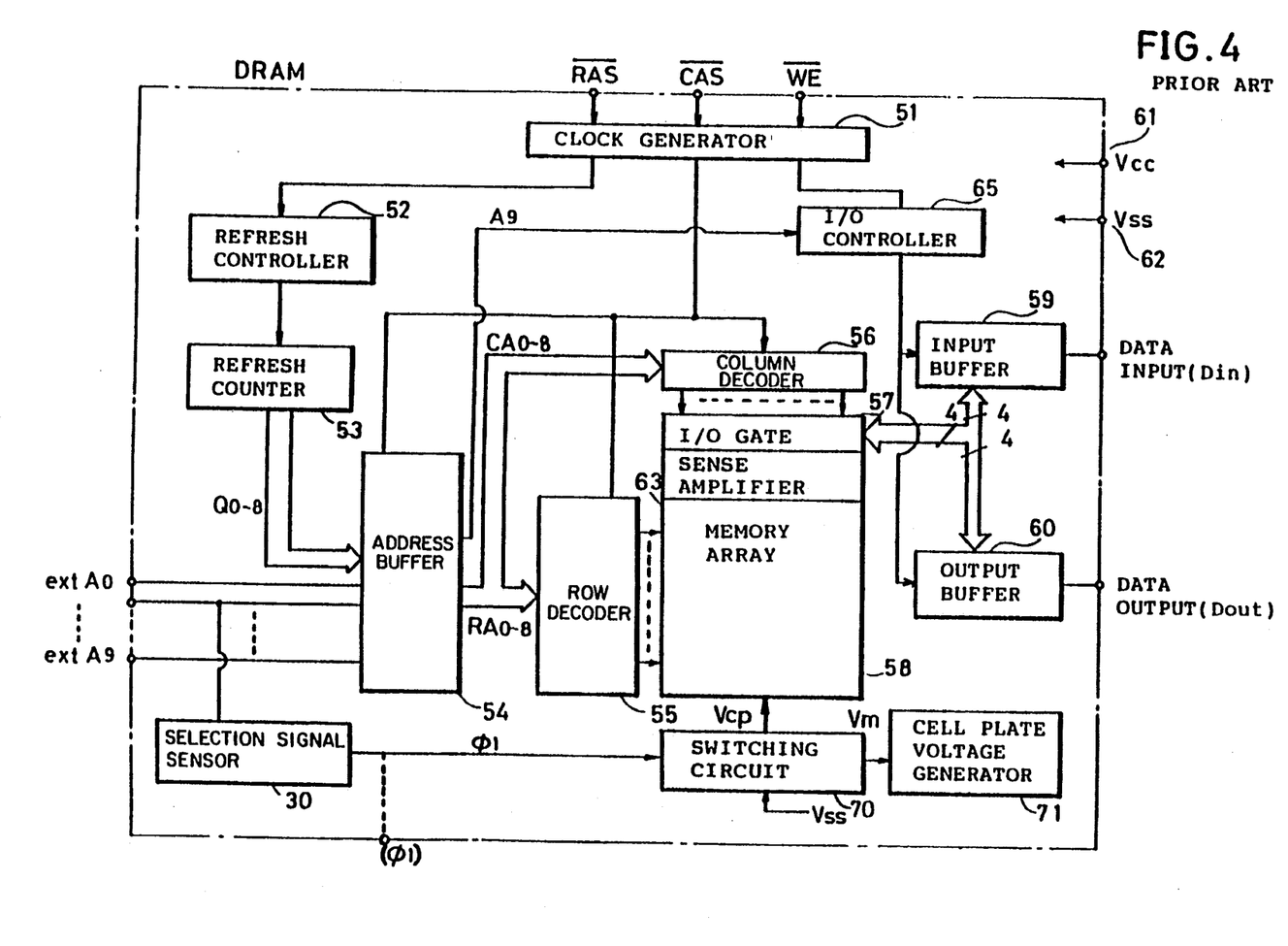
FIG. 4 is a block diagram showing an example of a conventional DRAM.

FIG. 4 is a block diagram showing an example of a conventional dynamic random access memory device, referred to hereinafter as DRAM. Referring to FIG. 4, this DRAM includes a memory array 58 composed of memory cells for storing data signals, an address buffer 54 for receiving address signals for selecting the memory cells, a row decoder 55 and a column decoder 56 for decoding the address signals, and a sense amplifier 63 connected to the memory array 58 and adapted for amplifying and reading signals stored in the memory cells. An input buffer 59 to which data signals $D_{in}$ are entered and an output buffer 60 from which data signals $D_{out}$ are outputted are connected to the memory array 58 via an I/O gate 57.

The address buffer 54 is connected for receiving external address signals ext. A0 to A9 or internal address signals Q0 to Q8 generated from a refresh counter 53. A refresh controller 52 is responsive to changing timing of $\overline{RAS}$ and $\overline{CAS}$ signals applied to a clock generator 51 to drive a refresh counter 53.

In addition to the above components, this DRAM further includes a cell plate voltage generator 71 for generating a voltage Vm to be applied to a cell plate of each memory cell, and a switching circuit 70 connected to receive a voltage Vm and a ground potential Vss and adapted for selectively outputting one of these voltages as a cell plate voltage Vcp. The switching circuit 70 operates in response to a control signal $\phi 1$. The signal $\phi 1$ is outputted by a selection signal detecting circuit 30 when a voltage higher than the supply voltage $V_{cc}$ is applied to any one of the address terminals. In another example, the signal $\phi 1$ is externally applied through a spare terminal without using the selection signal detecting circuit 30. However, if the DRAM has no spare terminal, the signal $\phi 1$ cannot be directly applied, since no terminal should be newly added for aging. It is noted that an external source voltage Vcc and the external ground voltage Vss are applied to this DRAM via terminals 61 and 62, respectively.

Figure 5:
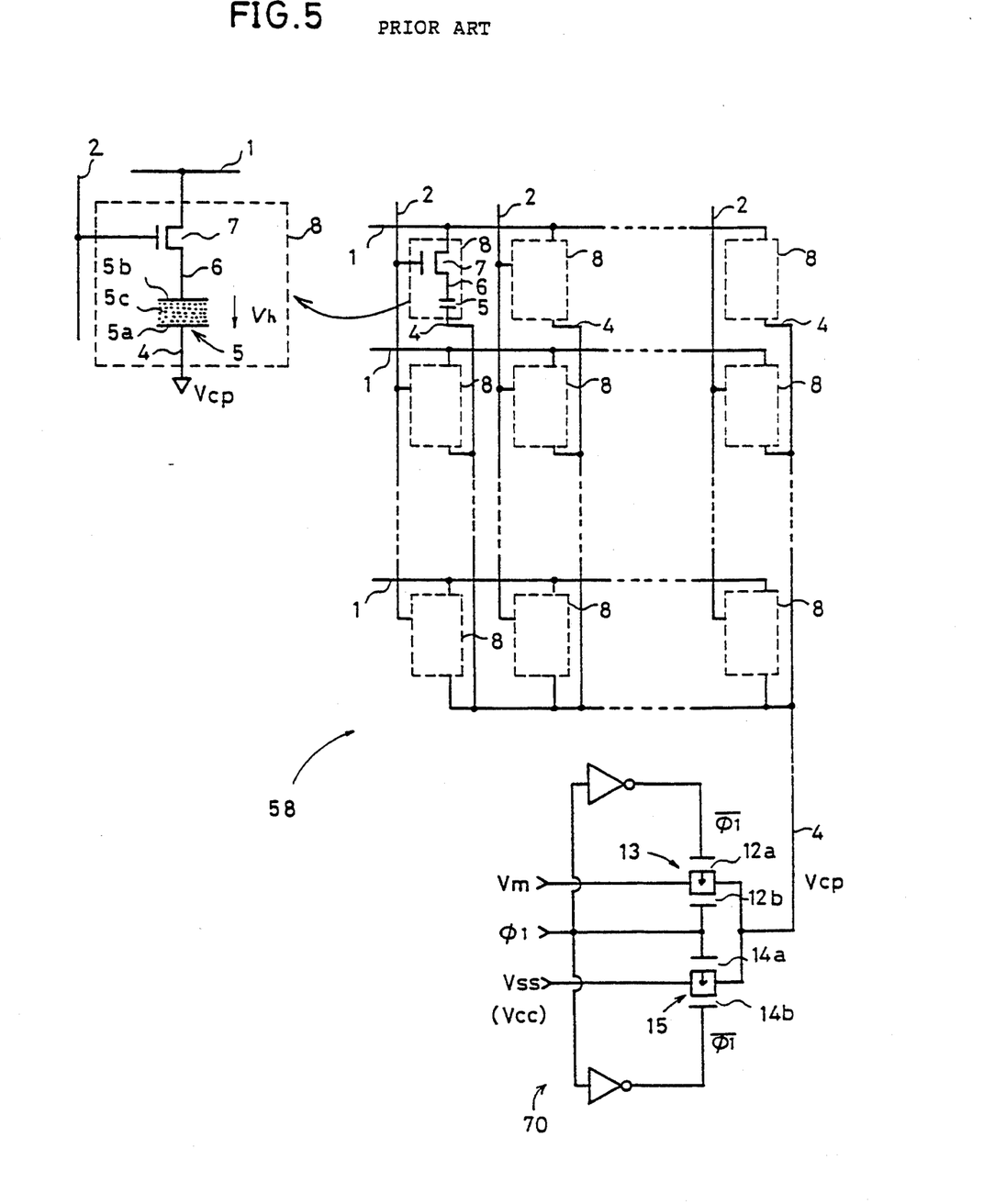
FIG. 5 is a circuit diagram showing a part of a memory array shown in FIG. 4 and a switching circuit.

FIG. 5 is a circuit diagram showing a part of the memory cell array 58 and the switching circuit 70 shown in FIG. 4. The circuit shown in FIG. 5 may be seen in the Japanese Patent Laying-Open No. 252598/1987.

Referring to FIG. 5, the memory array 58 includes a large number of memory cells 8 each connected between a bit line 1 and a word line 2. Each memory cell includes an NMOS transistor 7 for switching and a capacitor 5 for holding the data signal voltage. Each capacitor 5 has its one electrode 5a connected for receiving the cell plate voltage Vcp from the switching circuit 70 and the other electrode 5b connected to the transistor 7. The capacitor 5 includes an insulator 5c between its two electrodes 5a and 5b. The transistor 7 is connected between the bit line 1 and the other electrode 5b of the capacitor and has its gate connected to the word line 2.

The switching circuit 70 includes a transmission gate 13 connected for receiving the voltage Vm from the cell plate voltage generator 71 and a transmission gate 15 connected for receiving the ground voltage Vss. The transmission gate 13 includes a parallel connection of a PMOS transistor 12a and an NMOS transistor 12b. Similarly, the transmission gate 15 includes a parallel connection of a PMOS transistor 14a and an NMOS transistor 14b. Each of the transistors 12a and 14b has its gate connected to receive a control signal $\overline{\phi 1}$ and each of the transistors 12b and 14a has its gate connected to receive an inverted control signal $\phi 1$. The control signals $\phi 1$ and $\overline{\phi 1}$ are supplied from a control circuit not shown in FIG. 5. The voltage Vm has a value equal to $(Vcc - Vss)/2$.

During the usual read out or write mode, 5 volts of Vcc and 0 volt of Vss are supplied. One of the word lines 2 is brought to a high level by the row decoder 55 shown in FIG. 4, so that the associated transistor 7 is turned on. During the read out mode, the charges of data signal stored in the capacitor 5 are supplied to the associated bit line 1 via transistor 7. The sense amplifier 63 shown in FIG. 4 amplifies minute voltage changes in the bit line 1. The amplified signals are outputted via I/O gate 57 and the output buffer 60. During the write mode, data input signals applied from outside are transmitted to a selected one of bit lines 1 via input buffer 59 and I/O gate 57. The signal voltage on the bit line 1 is supplied to the other electrode 5b of the capacitors via the transistor 7 turned on by the row decoder 55.

During the above described usual read out and write modes, the voltage Vm $(=(Vcc - Vss)/2)$ is supplied to the other electrode 5a of the capacitor 5 as the cell plate voltage Vcp. That is, the transmission gate 13 is turned on responsive to the signal $\phi 1$ to transmit the voltage Vm to the one electrode 5a of the capacitor in each memory cell 8.

As a rule, an aging test is performed before shipping of the DRAM. Aging is a test in which a device is moderately stressed for a certain period until its properties are stabilized in a constant state. In aging DRAMs, insulating properties of the insulator 5c in the capacitor 5 included in the memory cell 8 shown in FIG. 5 are ascertained.

Figure 6:
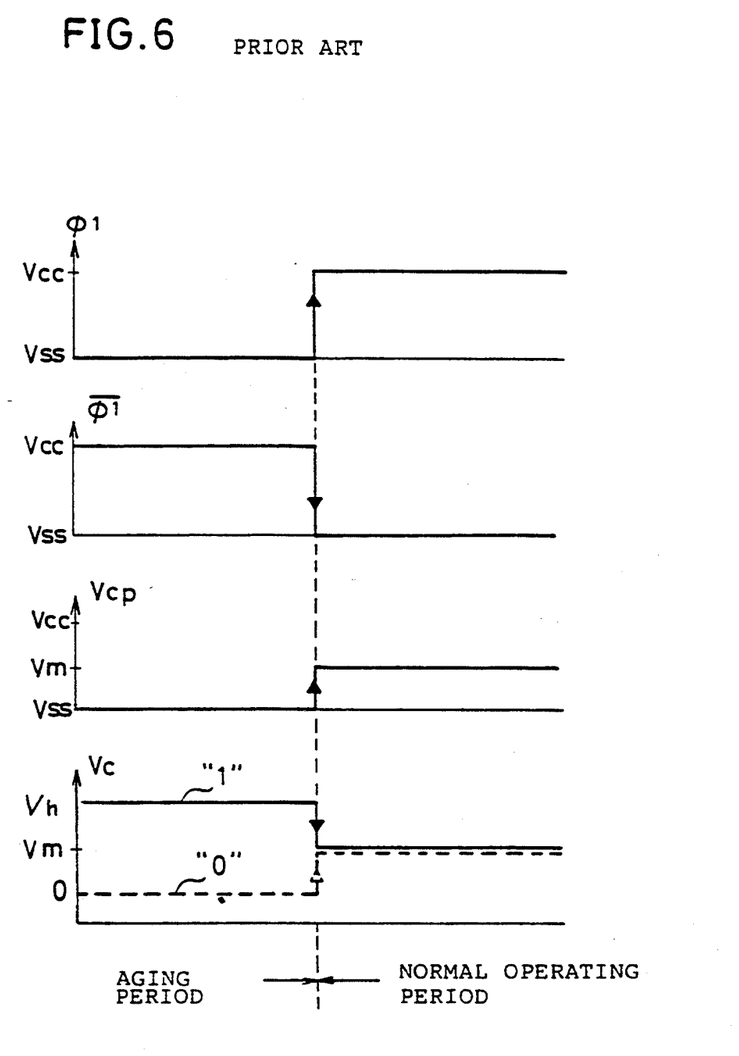
FIG. 6 is a timing chart for illustrating the aging operation in the circuit shown in FIG. 5.

FIG. 6 shows a timing chart for illustrating the aging operation in the circuit shown in FIG. 5. In the aging mode, 7 volts of Vcc and 0 volt of Vss are supplied. Referring to FIGS. 5 and 6, the transmission gate 15 is turned on responsive to a low level signal $\phi 1$ and a high level signal $\overline{\phi 1}$ generated by an inverter. Thus, the ground voltage Vss is supplied to the one electrode 5a of the capacitor via transmission gate 15 as the cell plate voltage Vcp. Simultaneously, an input data signal "1" for aging is supplied to the input buffer 59 shown in FIG. 4 for bringing a selected bit line 1 to the level of the source voltage Vcc. As a result, a higher voltage Vh $(=Vcc - Vss)$ is applied across the two electrodes 5a and 5b of the capacitor 5.

After the impression of this high voltage Vh is continued for a predetermined time, the usual write and read out operations of the DRAM are executed. When the insulator 5c in the capacitor 5 is free of defects, the written data signals are read out correctly. Conversely, when the insulator 5c in the capacitor is defective, correct data signal cannot be read out. The insulating properties of the insulator 5c of the capacitor included in the memory cell can be ascertained by the above described aging test.

In the above example, the ground voltage Vss is used as the cell plate voltage Vcp. However, the source voltage Vcc may also be used as the cell plate voltage. In this case, however, a data signal "0" is supplied to the input buffer 59 shown in FIG. 4 in place of "1" so that a selected one of the bit lines 1 is brought to the level of the ground voltage Vss. Hence, a higher voltage of opposite polarity $-Vh$ is applied across the two electrodes 5a and 5b of the capacitor 5.

As is apparent from the foregoing, it is noted that no terminal is provided in the DRAM for directly applying the cell plate voltage $V_{cp}$ from outside. The reason for this is that an additional terminal must be provided for externally and directly applying the voltage $V_{cp}$, which is not preferable.

In general, for ascertaining the insulating properties of an insulator, it is necessary to apply voltages having opposite polarities. This may be seen from a thesis publicized by Y. OHJI et al in a Symposium of International Reliability Physics held in 1987 and entitled "RELIABILITY OF NANO-METER THICK MULTILAYER DIELECTRIC FILMS ON POLY-CRYSTALLINE SILICON". However, in the conventional DRAMs, only a single polarity of test voltage either Vh or $-Vh$ can be applied to the insulator 5c of the capacitor 5 in the memory cell 8 during the aging test, so that it has not been possible to carry out a complete aging test for DRAMs.

A prior art having particular pertinence to the present invention may be seen in a U.S. Pat. No. 4,527,254 entitled "DYNAMIC RANDOM ACCESS MEMORY HAVING SEPARATED $V_{DD}$ PADS FOR IMPROVED BURN-IN", issued to Ryan et al on Jul. 2, 1985. In this prior art, an external voltage higher than the source voltage is applied to the DRAM during aging to shorten the time involved in aging. However, nothing is said of the polarity of the applied voltage.

An example of prior art having particular pertinence to the present invention is the Japanese Patent Laying-Open No. 232155/1987. In this prior art, a test voltage generator adapted for generating a voltage not less than the source voltage is included in the DRAM so that the voltage applied during aging has only one polarity.

Besides this prior art example, the Japanese Patent Laying-Open No. 192998/1987 also shows another example in which the voltage impressed during aging has only one polarity.

SUMMARY OF THE INVENTION

It is a primary object of the present invention to make possible more effective aging in DRAMs.

It is another object of the present invention to make possible more reliable aging of the capacitor included in the memory cell of the DRAMs.

It is still another object of the present invention to make possible more reliable checking of the insulating properties of the insulator interposed between two electrodes of the capacitor of a memory cell in a DRAM.

It is a further object to provide a circuit by which dual polarity aging testing can be accomplished without the requirement of external switching or provision of further connection to the DRAMs.

Stated briefly, the dynamic random access memory device of the present invention includes a circuit for applying first and second test voltages having opposite polarities across two electrodes of a capacitor in the memory cell. These first and second test voltages are larger in magnitude than the absolute value of the signal voltage applied across the two electrodes of capacitor means in the usual write mode. The memory device also includes means for receiving external selection signals for selecting one of these first and second test voltages and a selection circuit responsive to the selection signals to select the test voltage to be applied to the capacitor in the memory cell from the test voltage applying circuit.

In operation, the first and second test voltages having opposite polarities are applied across two electrodes of the capacitor means in the memory cell in response to the selection signals. In this manner, the test voltages having opposite polarities are alternately applied to the insulator in the capacitor to provide for achieving a more reliable checking of the insulating properties of the insulator.

The method of operation of the dynamic random access memory device of the present invention includes a step of receiving an external selection signal for selecting the polarity of the test voltage applied across two electrodes of the capacitor in the memory cell, a step of applying a first test voltage of one polarity across two electrodes of the capacitor in the memory cell in response to the external selection signal, and a step of impressing a second test voltage having the opposite polarity to that of the first test voltage across two electrodes of the capacitor in the memory cell in response to the external selection signal. In this manner, the insulating properties of the insulator provided between the two electrodes of the capacitor in the memory cell can be checked more reliably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
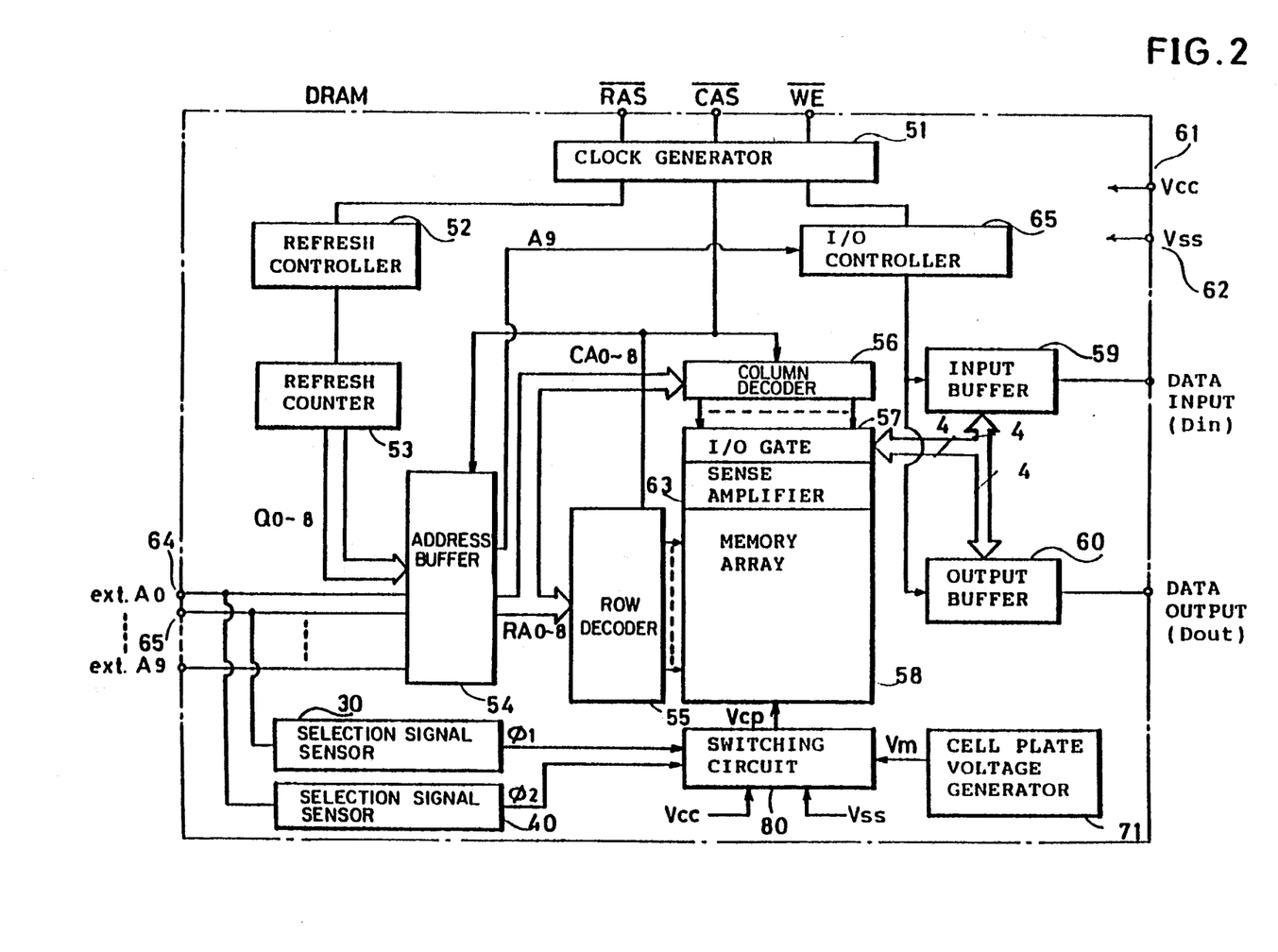
FIG. 2 is a block diagram of a DRAM according to an embodiment of the present invention.

FIG. 2 is a block diagram of a DRAM showing an embodiment of the present invention. Referring to FIG. 2, the DRAM shown therein differs from the conventional DRAM shown in FIG. 4 in the following respect.

That is, the DRAM shown in FIG. 2 includes an improved selection circuit 80 connected to receive the source voltage Vcc, the ground voltage Vss and the voltage Vm from a cell plate voltage generator 71, and selection signal sensors 30 and 40 connected to address input terminals 65 and 64, respectively. These two selection signal sensors 30 and 40 output switching control signals $\phi1$ and $\phi2$, respectively. The selection circuit 80 is connected to receive the signals $\phi1$ and $\phi2$. Since the circuitry is otherwise the same as that of the DRAM shown in FIG. 4, the corresponding description is omitted for simplicity.

Figure 1A:
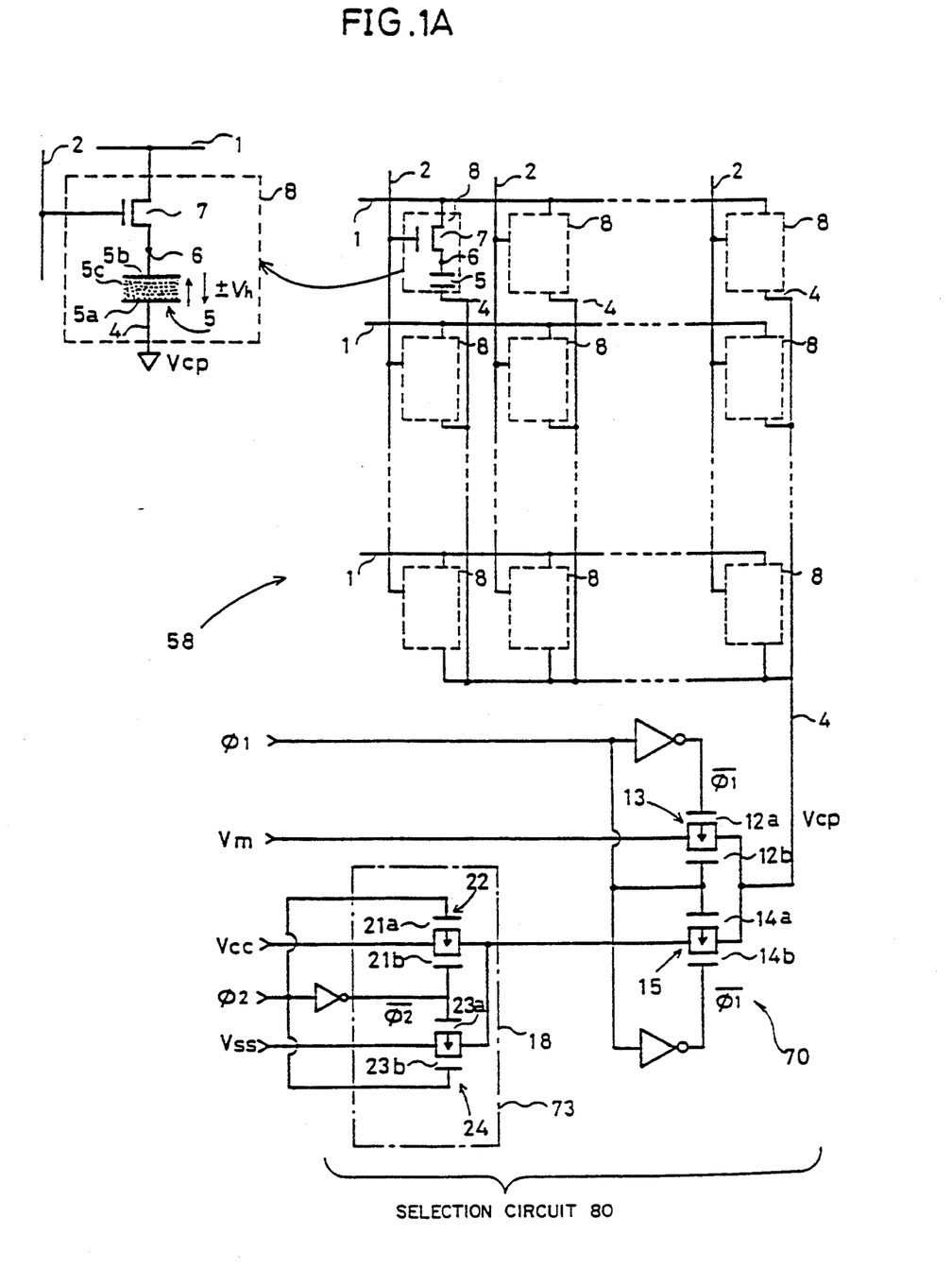
FIG. 1A is a circuit diagram showing a part of a DRAM shown in FIG. 2 according to an embodiment of the present invention.

FIG. 1A is a circuit diagram showing a part of the memory array 58 shown in FIG. 2 and an improved selection circuit 80. Referring to FIG. 1A, the selection circuit 80 includes, in addition to the conventional switching circuit 70, another switching circuit 73. The switching circuit 73 includes a transmission gate 22 for switching control of the source voltage Vcc and a transmission gate 24 for switching control of the ground voltage Vss. The transmission gate 22 includes a parallel connection of conduction paths of a PMOS transistor 21a and an NMOS transistor 21b. The transmission gate 24 includes a PMOS transistor 23a and an NMOS transistor 23b. Each of the transistors 21a and 23b is connected to receive a signal $\phi2$ from a selection signal sensor 40 shown in FIG. 2. Each of the transistors 21b and 23a has its gate connected to receive an inverted signal $\overline{\phi2}$ from the selection signal sensor 40. It is noted that the transmission gates 13 and 15 in the switching circuit 70 are controlled by a switching control signal $\phi1$ from the selection signal sensor 30 shown in FIG. 2.

Figure 1B:
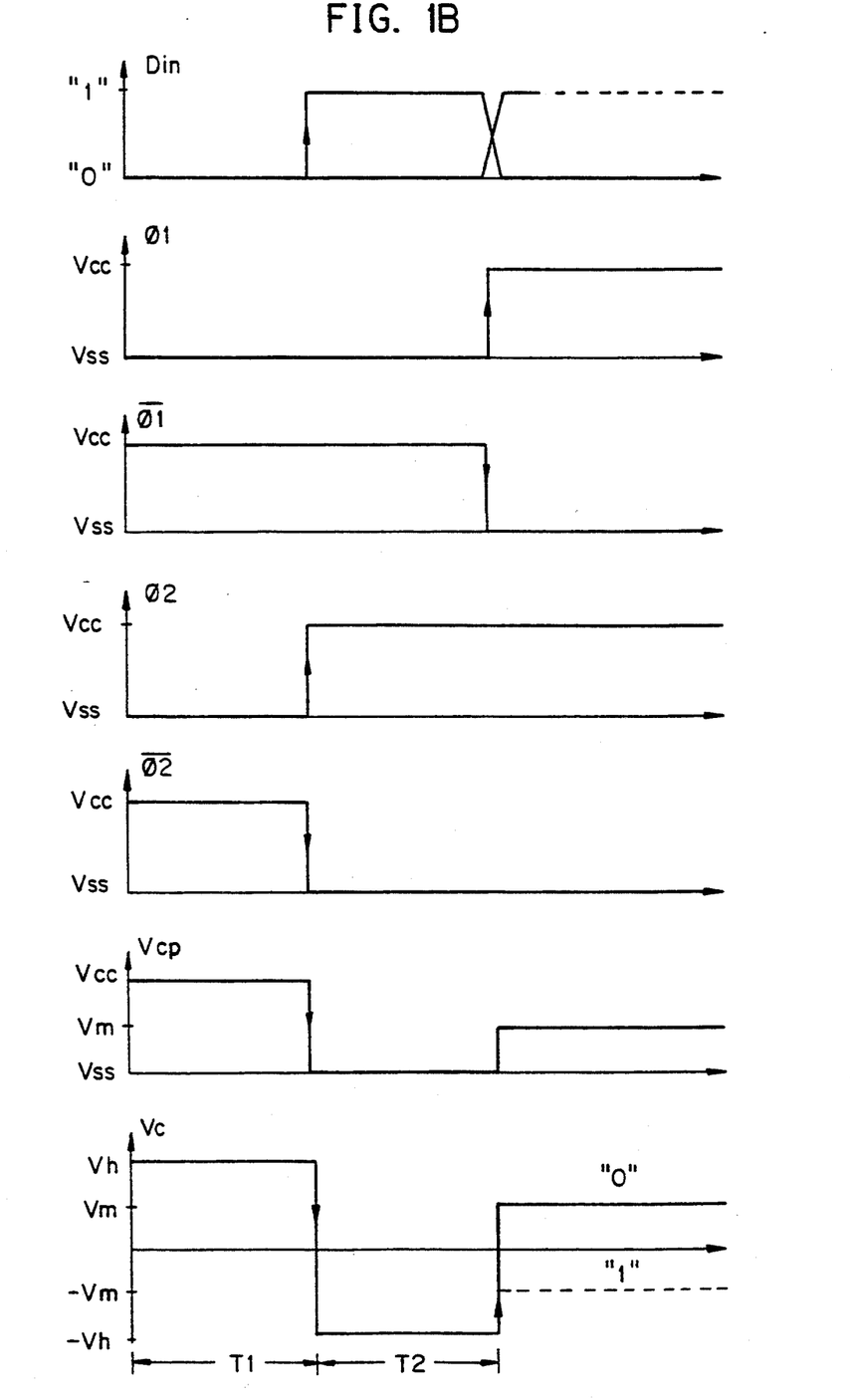
FIG. 1B is a timing chart for illustrating the aging operation in the circuit shown in FIG. 1A.

FIG. 1B shows a timing chart for illustrating the aging operation in the circuit shown in FIG. 1A. The operation of the system is now explained by referring to FIG. 1A and FIG. 1B.

During the usual read out or write modes, 5 volts of Vcc and 0 volt of Vss are supplied. When no external selection signals are applied to the terminal 65 shown in FIG. 2 and the selection signal sensor 30 outputs a high level switching signal $\phi1$. The transmission gate 13 is turned on in response to this signal $\phi1$, while the transmission gate 15 is turned off. As a result, the voltage Vm (=(Vcc−Vss)/2) is applied to one electrode 5a of a capacitor 5 in a memory cell 8 as the cell plate voltage Vcp.

During the aging mode, for example, 7 volts of Vcc and 0 volt of Vss are supplied. An external selection signal is applied to the terminal 65 shown in FIG. 2. A voltage of 9 volts, for example, is applied as the external selection signal to the terminal 65. The detection level of the selection signal detector 30 is set at about 8.5 volts in advance. The higher voltage sensor 30 is responsive to this higher voltage to output a low level signal $\phi1$, so that the transmission gate 13 is turned off and the transmission gate 15 is turned on.

During the first half of the aging period T1, the external selection signal (9 volts) is additionally supplied to a terminal 64 shown in FIG. 2. The selection signal sensor 40 is responsive to this voltage to output a low level signal $\phi2$. The transmission gate 22 is turned on responsive to this signal $\phi2$. Thus, the source voltage Vcc is applied to one electrode 5a of the capacitor 5 in the memory cell 8 via the transmission gates 22 and 15. Simultaneously, a data input signal "0" is supplied to the input buffer 59 shown in FIG. 2, so that the bit line 1 is brought to the ground voltage Vss. The transistor 7 in the memory cell 8 is turned on responsive to the signal from the row decoder 55, so that the other electrode 5b of the capacitor 5 is brought to the ground voltage Vss.

During the second or latter half of the aging period T2, no external selection signal is applied to the terminal 64 shown in FIG. 2. The selection signal sensor 40 thus outputs a high level signal $\phi2$, so that the transmission gate 22 is turned off, while the transmission gate 24 is turned on. As a result, the ground voltage Vss is applied to one electrode 5a of the capacitor 5 in the memory cell 8 via transmission gate 24 and 15. Simultaneously, a data input signal "1" is supplied to the input buffer 59 shown in FIG. 2 so that the bit line 1 is brought to the source voltage Vcc. The transistor 7 in the memory cell 8 is turned on responsive to the signal from the row decoder 55 so that the other electrode 5b of the capacitor 5 is brought to the source voltage Vcc.

In this manner, as shown in FIG. 1B, voltages $\pm V_h$ (=$\pm$(Vcc−Vss)) in the opposite senses are applied across the electrodes of the capacitor 5 during the first and second halves T1 and T2 of the aging period. This permits the insulating properties of the insulator between the electrodes 5a and 5b of the capacitor 5 to be checked correctly while shortening the time involved in aging.

It is noted that although the switching circuit 80 shown in FIG. 1A is formed of CMOS transistors, it may be formed only by the PMOS transistors or by NMOS transistors.

Figure 3A:
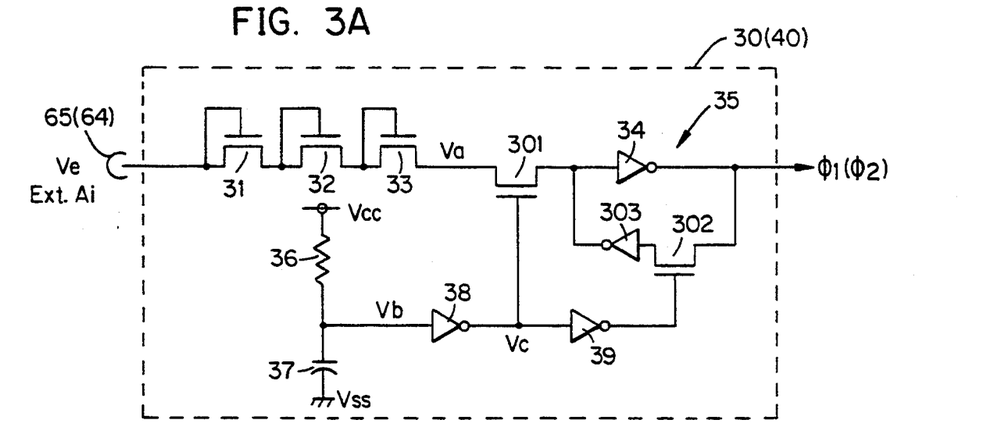
FIG. 3A is a circuit diagram showing an example of a selection signal sensor as used in FIG. 2.

A selection signal sensor 30 (or 40) is illustrated in FIG. 3A and its operation described with reference to FIG. 3B. Selection signal sensor 30 includes NMOS transistors 31, 32, 33, 301 and 302, inverters 34, 38 and 39, a resistance 36 and a capacitor 37. Transistors 31, 32 and 33 are connected in series in a diode-connected manner between transistor 301 and a terminal 65 for an external address signal ext.Ai.

Figure 3B:
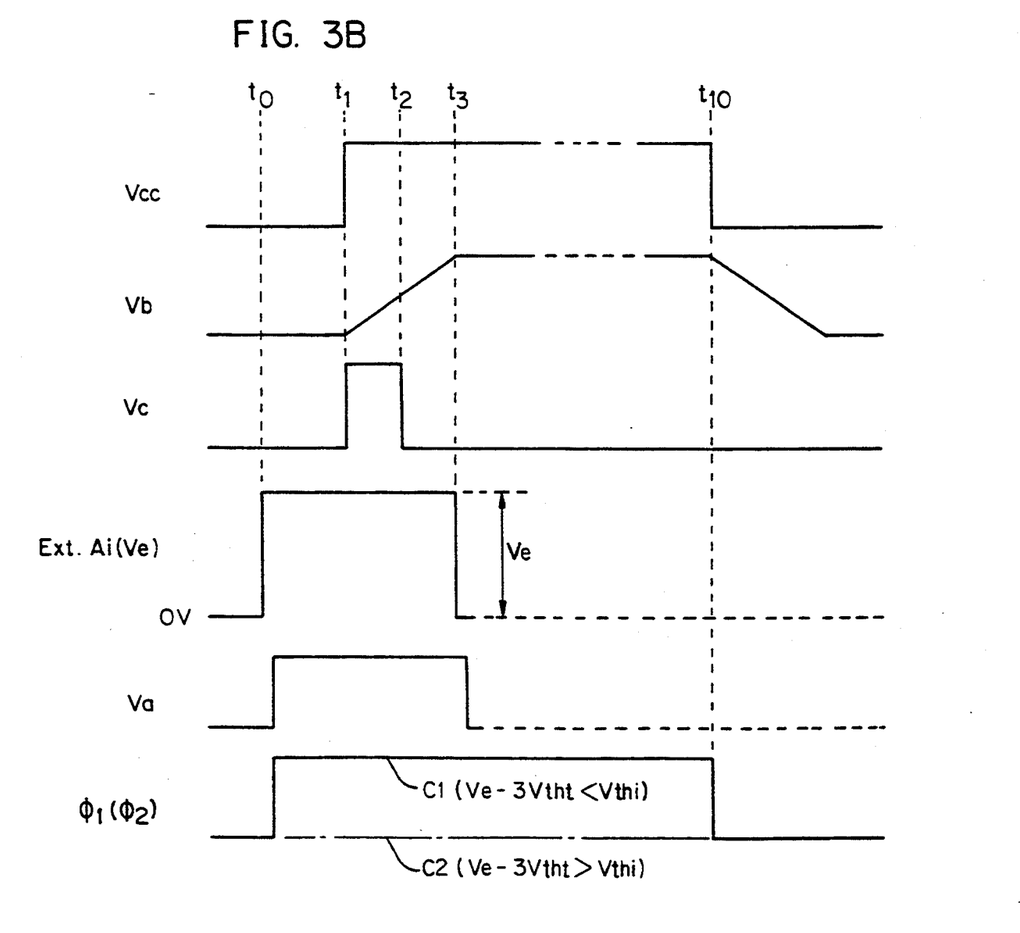
FIG. 3B is a timing diagram illustrating the operation of the selection signal sensor of FIG. 3A.

As shown in FIG. 3B, at time t1, supply voltage $V_{cc}$ is applied. Input voltage $V_b$ of inverter 38 is kept at a low level for a while immediately after the application of supply voltage $V_{cc}$. As a result, inverter 38 provides an output voltage $V_c$ at the high level in the period from t1 to t2. Consequently, in this period, transistor 301 turns on while transistor 302 turns off. As transistor 302 is not conductive, a latch circuit 35 is not effectively formed by inverters 34 and 303 in this period.

After time t2, in response to the rise of voltage $V_b$, the output voltage $V_c$ of inverter 38 is lowered. Consequently, transistor 301 turns off, while transistor 302 turns on. As the transistor 302 is rendered conductive, a latch circuit 35 is formed by inverters 34 and 303. Latch circuit 35 holds the voltage which has been applied through transistor 301 before time t2.

The threshold voltage of each of the transistors 31, 32 and 33 in FIG. 3A is referred to as Vtht while the threshold voltage of inverter 34 is represented by Vthi. To provide an output of a high level output signal $\phi1$ (or $\phi2$), a voltage Ve (Ve−3Vtht<Vthi), not exceeding supply voltage $V_{cc}$, is applied to terminal 65 (64). As a result, after the rise of supply voltage $V_{cc}$, a low level voltage Va is applied through transistor 301 to inverter 34 in the period from t1 to t2. After t2, transistor 301 turns off, while transistor 302 turns on. Therefore, a high level voltage signal $\phi1$ is held by the latch circuit. In other words, a high level signal $\phi1$ is output (see curve C1 of FIG. 3B).

In order to provide a signal $\phi1$ ($\phi2$) of a low level, a voltage Ve (Ve−3Vtht>Vthi) higher than supply voltage $V_{cc}$ is applied through terminal 65 (64). Accordingly, in the period from t1 to t2, a high voltage Va is applied through transistor 301 to inverter 34. Inverter 34 provides a low level signal $\phi1$. After time t2, latch circuit 35 is effectively formed by inverters 34 and 303, the low level signal $\phi1$ is held by latch circuit 35 (see line C2 of FIG. 3B). As can be understood from this description, by selecting a voltage applied to address signal input terminal 65 (or 64), an output signal $\phi1$ (or $\phi2$) having a desired level can be provided as an output.

For resetting selection signal sensor 30 (40), supply voltage $V_{cc}$ is turned off, and after a prescribed time period, a supply voltage $V_{cc}$ is applied without applying any voltage to terminal 65. Consequently, high voltage sensor 30 is reset. After the resetting operation, selection signal sensor 30 outputs a high level signal $\phi1$.

As described above, the level of the output signal $\phi1$ (or $\phi2$) is determined by the level of the voltage applied to terminal 65 in the period time t1 to t2, that is, the period immediately after the application of supply voltage $V_{cc}$. After this period, since the transistor 301 turns off as described above, the latched state is not changed unless supply voltage $V_{cc}$ is turned off. In other words, after this period, the level of output signal $\phi1$ is not changed no matter what level of voltage is applied to terminal 65 (64).

The operation of the selection signal sensor 30 (40) is integrated into the previously described aging process as illustrated in FIGS. 1A, 1B and 2. At the start of the aging mode, a selection signal satisfying the relation $Ve-3Vtht>Vthi$ is applied to terminal 65 shown in FIG. 2. As a result, selection signal sensor 30 outputs a low level signal $\phi1$ in response to this selection sensor, and holds the same. Therefore, transmission gate 13 shown in FIG. 1A turns off, while transmission gate 15 turns on. By the above described operation, the aging mode is defined in the DRAM.

In the first half aging period T1 shown in FIG. 1B, a selection signal satisfying the relation $Ve-3Vtht>Vthi$ is also applied to terminal 64. Therefore, selection signal sensor 40 outputs a low level signal $\phi2$ in response to the applied selection signal, and holds the low level signal. Transmission gate 22 turns on in response to the signal $\phi2$. Therefore, supply voltage $V_{cc}$ is applied to one electrode 5a of capacitor 5 in memory cell 8 through transmission gates 22 and 15.

When the DRAM is in this state, that is, when the aging mode is defined therein, the data signal of "0" is written to all the memory cells in the memory array 58. More specifically, by repeatedly applying external address signals ext.A0 through ext.A9, all memory cells in memory array 58 are designated successively, and data signal "0" applied through a data input terminal is written to the designated memory cell.

The writing of data signal "0" corresponds to application of the ground voltage Vss to the other electrode 5b of capacitor 5 shown in FIG. 1A. As the data signal "0" is written in all the memory cells, an electric field of one polarity can be applied to the insulator between the electrodes 5a and 5b of each capacitor in the first half aging period T1 (see FIG. 1B).

Before the start of the second half T2 of the aging period, the above-described resetting operation is carried out. Namely, supply voltage $V_{cc}$ is turned off, and selection signal sensors 30 and 40 are reset. At the second half (T2) of the aging period, in order to define the aging mode at first, a selection signal satisfying the relation $Ve-3Vtht>Vthi$ is applied to terminal 65. As a result, selection signal sensor 30 outputs a low level signal $\phi1$. Therefore, aging mode is defined in the DRAM.

In the second half (T2) of the aging period, a selection signal is not applied to terminal 64. Therefore, selection signal sensor 40 outputs a high level signal $\phi2$ and holds the same. Accordingly, transmission gate 22 turns off and transmission gate 24 turns on. Consequently, ground voltage Vss is applied to one electrode 5a to capacitor 5 in memory cell 8 through transmission gates 24 and 15.

Thereafter, data signal "1" is written to all the memory cells in memory array 58. More specifically, by repeatedly applying external address signals ext.A0 through ext.A9, memory cells are successively designated and data signal "1" is written to each memory cell. Writing of data signal "1" corresponds to application of the supply voltage $V_{cc}$ to the other electrode 5b of capacitor 5 shown in FIG. 1A. Consequently, an electric field opposite to that of the first half aging period T1 is applied to the insulator between electrodes 5a and 5b of capacitor 5 in each memory cell 8.

As a result of the above-described operations in the first and second halves T1 and T2 of the aging period, electric fields of opposite polarities have been applied to the insulator between electrodes of each capacitor 5.

After the aging periods (T1 and T2), in a normal operation period, writing and reading of test data are carried out for every memory cell. More specifically, known test data signal is written to all the memory cells, and stored data signals are read from the memory cells. When the read data signals coincides with the test data signal written, it is determined that all the memory cells are in the "normal" state. In other words, it is confirmed that no fault has occurred in the insulator of the capacitor of each memory cell even when electric fields of opposite polarities are applied. When the read data signal does not coincide with the written data signal, it is recognized that a fault has occurred in the insulator of capacitor 5 by the application of the bi-directional electric fields.

Since electric fields of opposite polarities are applied to the insulator between electrodes 5a and 5b of capacitor 5 in every memory cell of DRAM, the insulation qualities of the insulator can be confirmed with certainty. In other words, the insulating capability of the insulator inserted between electrodes of the capacitor 5 can be accurately determined.

Also, in the above described embodiment, an example has been shown in which the voltage $Vm(=(Vcc-Vss)/2)$ is outputted from the cell plate voltage generator 71. However, it only suffices that the voltage $V_m$ be constant and the above specific value is not limitative of the present invention.

It may be seen from the foregoing that the test voltages having opposite polarities are alternately applied by external control across the electrodes 5a and 5b of the capacitor in the memory cell 8 shown in FIG. 1A, so that the insulating properties of the insulator 5c provided between the two electrodes 5a and 5b can be set more accurately. Thus it becomes possible to perform a more reliable aging test of memory cells included in a DRAM.

Although the present invention has been described and illustrated in detail, it is clearly understood that the same is by way of illustration and example only and is not to be taken by way of limitation, the spirit and scoped of the present invention being limited only by the terms of the appended claims.

What is claimed is:

1. A dynamic random access memory device comprising:
   a plurality of memory cells each including capacitor means for holding data signals applied from an external source,
   said memory device having a test mode for aging said device and a write mode,
   said capacitor means in said memory cell including a first electrode and a second electrode facing each other and separated by an insulator,
   during the write mode, a signal voltage corresponding to data signals being applied across said two electrodes of said capacitor means for holding the data signals,
   in the test mode, a test voltage higher than the signal voltage corresponding to said data signals being applied across said two electrodes of said capacitor means for checking the insulating properties of said insulator,
   test voltage applying means connected to said memory cells for applying first and second test voltages of opposite polarity across said two electrodes of said capacitor means in each of said memory cells,
   each of said first and second test voltages being larger in magnitude than the absolute value of the signal voltage applied across the two electrodes of said capacitor means in the write mode,
   memory signal receiving means for receiving external selection signals for selecting one of said first and second test voltages applied to said capacitor means;
   selection means connected to said test voltage applying means and responsive to said external selection signals, for switching between polarities of test voltage thereby selecting said first and second test voltages to be applied to said capacitor means in each of said memory cells by said test voltage applying means; and
   latch means for storing said external selection signal from said memory signal receiving means and, in response, controlling said selection means to selectively apply one of said first and second test voltages to said capacitor means.

2. The dynamic random access memory device according to claim 1, wherein said test voltage applying means includes
   first voltage supply means for supplying a first voltage to a first electrode of said capacitor means in each memory cell,
   second voltage supply means for supplying a second voltage to the first electrode of said capacitor means in each memory cell, and
   voltage holding means connected to a second electrode of said capacitor means in each memory cell for holding said second electrode at a third voltage or a fourth voltage,
   said first test voltage of one polarity is applied across said two electrodes of said capacitor means in each memory cell when said first and third voltages are applied to said first and second electrodes respectively and said second test voltage of opposite polarity is applied across said electrodes when said second and fourth voltages are applied to said first and second electrodes respectively.

3. The dynamic random access memory device according to claim 1, further comprising
   memory signal receiving means for receiving external address signals used for usual memory operation, and
   selection signal sensor means connected to said memory signal receiving means for detecting an external selection signal applied thereto,
   a switching control signal being formed responsive to an external selection signal detected by said selection signal sensor.

4. The dynamic random access memory device according to claim 3 wherein
   said memory signal receiving means includes an address buffer, and
   signals received by said memory signal receiving means during the write mode include address signals.

5. A dynamic random access memory device comprising:
   a plurality of memory cells each including capacitor means for holding data signals applied from an external source,
   said memory device having a test mode for aging and a write mode,
   said capacitor means in said memory cell including a first electrode and a second electrode facing each other and separated by an insulator,
   during the write mode, a signal voltage corresponding to data signals being applied across said two electrodes of said capacitor means for holding the data signals,
   in the test mode, a test voltage higher than the signal voltage corresponding to said data signals being applied across said two electrodes of said capacitor means for checking the insulating properties of said insulator;
   test voltage applying means connected to said memory cells for applying first and second test voltages of opposite polarity across said two electrodes of said capacitor means in each of said memory cells;
   each of said first and second test voltages being larger in magnitude than the absolute value of the signal voltage applied across the two electrodes of said capacitor means in the write mode;
   memory signal receiving means for receiving external selection signals for selecting one of first and second test voltages applied to said capacitor means; and
   selection means connected to said test voltage applying means and responsive to said external selection signals, for switching between polarities of test voltage to be applied to said capacitor means in each of said memory cells by said test voltage applying means,
   wherein said test voltage applying means including
   (i) first voltage supply means for supplying a first voltage to a first electrode of said capacitor means in each memory cell,
   (ii) second voltage supply means for supplying a second voltage to the first electrode of said capacitor means in each memory cell, and
   (iii) voltage holding means connected to a second electrode of said capacitor means in each memory cell for holding said second electrode at a third voltage or a fourth voltage,
   said first test voltage of one polarity being applied across said two electrodes of said capacitor means in each memory cell when said first and third voltages are applied to said first and second electrodes respectively and said second test voltage of opposite polarity being applied across said electrodes when said second and fourth voltages are applied to said first and second electrodes respectively, said selection means including switching means connected to said first and second voltages supply means responsive to said external selection signals for applying said first or second voltages to said first electrode of said capacitor means in each memory cell, said voltage holding means responsive to the external selection signals for establishing said first or fourth voltages at the second electrode of the capacitor means in each memory cell.

6. The dynamic random access memory device according to claim 5, wherein said voltage holding means includes:

means for receiving external test data signals for applying the third or fourth voltage to the second electrode of said capacitor means in each memory cell, said test data signals being supplied from an external source responsive to the external selection signals, and means being responsive to said test data signals for applying the third or fourth voltage to the second electrode of said capacitor means in each memory cell.

7. The dynamic random access memory device according to claim 5, wherein said switching means includes first transmission gate means connected between the output of said first voltage supply means and the first electrode of said capacitor means in each memory cell, and activated responsive to external selection signals, and second transmission gate means connected between the output of said second voltage supply means and the first electrode of said capacitor means in the memory cell and activated responsive to the external selection signals, said first and second transmission gate means alternately being made conductive responsive to the external selection signals.

8. The dynamic random access memory device according to claim 5, wherein said first voltage includes a source voltage, said second voltage includes a ground voltage, said third voltage includes the ground voltage, and said fourth voltage includes the source voltage.

9. In a dynamic random access memory having an array of memory cells, each said memory cell including at least a transistor and a capacitor, said dynamic random access memory further including a buffer means for applying a logic level voltage to a conduction terminal of said transistor, a cell plate voltage generator, a circuit means for applying a voltage generated by said cell plate voltage generator to a first plate of said capacitor and an address buffer responsive to external address selection signals for selecting memory cells, the improvement comprising:

at least two means responsive to external address selection signals for generating switching control signals means for receiving external address selection signals arranged to provide such external address selection signals to said address buffer activated to select at least one memory cell for the purpose of stress testing after said switching control signals are generated, a switching circuit interposed in said circuit means and receiving first and second supply voltages corresponding to first and second logic voltage levels, respectively, and said switching control signals for controlling said switching circuit, whereby said switching circuit supplies a respective one of said first and second supply voltages to said first plate of said capacitor.

10. In the dynamic random access memory as recited in claim 9, the improvement further comprising:

timing means for controlling durations of voltages for application to said means for generating switching control signals to establish an aging period during which an insulator in said capacitor is to be stabilized.

11. In the dynamic random access memory as recited in claim 10, the improvement further comprising:

means for controlling all of said transistors of said memory cells in common and in synchronism with said timing means to impress voltage across said capacitor of said memory cell of opposite polarity during respective portions of said aging period in order to stabilize the insulator in said capacitor of each memory cell.

12. In the dynamic random access memory as recited in claim 9, the improvement further comprising:

said means for generating switching control signals including voltage sensors.

13. In a dynamic random access memory as recited in claim 12, the improvement further comprising:

input connections of said voltage sensors comprising connections to respective address inputs of said dynamic random access memory.

14. In a dynamic random access memory as recited in claim 13, the improvement further comprising:

said connections to respective address inputs being made to respective most significant bits of said address inputs.

15. In a dynamic random access memory as recited in claim 9, the improvement further comprising:

said switching circuit being formed in an integrated circuit with said dynamic random access memory.

16. In a dynamic random access memory having a plurality of memory cells, each comprising a transistor controllable by a voltage applied to a word line to which a control terminal of said transistor is connected in response to a voltage applied at address terminals of said dynamic random access memory and a capacitor having first and second electrodes and an insulator therebetween, said first electrode comprising a cell plate and said second electrode being connected to a first conduction terminal of said transistor; a second conduction electrode of said transistor being connected to a bit line, said dynamic random access memory further comprising a cell plate voltage generator, switching means for connecting at least said cell plate voltage generator and said cell plate, and data buffer means for applying one of first and second logic levels to said bit lines, a method of stabilizing said insulator of each of said capacitors comprising the steps of:

(a) establishing first and second supply voltages corresponding, respectively, to first and second logic levels, (b) applying both of said first and second supply voltages to said switching means, (c) applying predetermined voltages to the address terminals of said dynamic random access memory for at least two successive predetermined time periods, (d) detecting a voltage on at least one of said address input terminals and generating at least one control signal in response thereto, (e) applying each one of said first and second logic levels to said bit lines in synchronism with the application of address signals to said address terminals for a predetermined time period;

(f) controlling said switching means in response to a first of said at least one control signal to select one of said first and second supply voltages to be applied to said cell plate during a first of said two successive predetermined time periods, and (g) controlling said switching means in response to a second of said at least one control signal to select a second of said first and second supply voltages to be applied to said cell plate during a second of said two successive predetermined time periods.

17. A method of operation for operating a dynamic random access memory device, including a plurality of memory cells, each including capacitor means for holding external data signals, said memory device having a test mode for aging and a writing mode, said capacitor means in each memory cell including a first electrode and a second electrode facing each other and separated by an insulator, data signals being held during the writing mode upon the application of a signal voltage corresponding to the data signals across the two electrodes of said capacitor means, insulating properties of said insulator being checked during the test mode upon the application of a test voltage across the two electrodes of said capacitor means, said test voltage being higher than the signal voltage corresponding to said data signals, said method comprising the steps of;

(a) preparing first and second test voltages to be applied to the two electrodes of said capacitor means in each memory cell, said first and second test voltages having opposite polarities, said first and second test voltages being larger in magnitude than the absolute value of the signal voltage applied across the two electrodes of said capacitor means during the writing mode;

(b) receiving at predetermined terminals external selection signals for selecting one of the first and second test voltages to be applied to said capacitor means;

(c) applying the first test voltage responsive to said external selection signals across the two electrodes of said capacitor means in each memory cell after selecting at least one memory cell corresponding to an address signal applied to external terminals including said predetermined terminals, said external terminals including said predetermined terminals being connected to an address buffer; and (d) applying the second test voltage responsive to said external selection signals across the two electrodes of said capacitor means in each memory cell.

18. A dynamic random access memory device comprising:

a plurality of memory cells each including capacitor means for holding data signals applied from an external source, said memory device having a test mode for aging said memory device and a write mode for applying a signal voltage to said memory device;

said capacitor means in said memory cell including a first electrode and a second electrode facing each other and separated by an insulator;

test voltage applying means connected to said memory cells for applying first and second test voltages of opposite polarity across said two electrodes of said capacitor means in each of said memory cells;

each of said first and second test voltages being larger in magnitude than the absolute value of the signal voltage applied across the two electrodes of said capacitor means in the write mode;

memory signal receiving means for receiving external selection signals for selecting one of first and second test voltages to be applied to said capacitor means, said memory signal receiving means being connected to an address buffer;

selection means connected to said test voltage applying means and responsive to said external selection signals, for switching between polarities of a test voltage to be applied to said capacitor means in each of said memory cells by said test voltage applying means; and latching means for latching said selection means to maintain a selected polarity after a corresponding external selection signal is no longer present at said memory signal receiving means;

wherein said memory signal receiving means are connected to apply address signals to said address buffer to select memory cells during a test mode.

* * * * *

UNITED STATES PATENT AND TRADEMARK OFFICE
CERTIFICATE OF CORRECTION

PATENT NO. : 5,337,272
DATED : August 9, 1994
INVENTOR(S) : Makoto SUWA et al.

It is certified that error appears in the above-indentified patent and that said Letters Patent is hereby corrected as shown below:

On the title page, please delete item [54] and insert the following therefor:

--[54] CIRCUIT FOR APPLYING SELECTED VOLTAGES TO DYNAMIC RANDOM ACCESS MEMORY EFFECTIVE AGING AND MEMORY CELL TESTING--

Signed and Sealed this

Twenty-first Day of February, 1995

Attest:

BRUCE LEHMAN

Attesting Officer   Commissioner of Patents and Trademarks